United States Patent
Ma

(10) Patent No.: US 6,827,587 B2
(45) Date of Patent: Dec. 7, 2004

(54) ELECTRICAL CONNECTOR ASSEMBLY HAVING RESTRAINING STRUCTURE

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 69 days.

(21) Appl. No.: 10/407,991

(22) Filed: Apr. 3, 2003

(65) Prior Publication Data

US 2004/0058567 A1 Mar. 25, 2004

(30) Foreign Application Priority Data

Sep. 25, 2002 (TW) ...................................... 91215143 U

(51) Int. Cl.⁷ .............................................. H01R 12/00
(52) U.S. Cl. ........................................ 439/73; 439/331
(58) Field of Search .................................. 439/73, 331

(56) References Cited

U.S. PATENT DOCUMENTS

| | | | | |
|---|---|---|---|---|
| 4,504,105 A | * | 3/1985 | Barkus et al. ............... | 439/331 |
| 4,621,884 A | * | 11/1986 | Berkebile et al. ............ | 439/367 |
| 4,692,790 A | * | 9/1987 | Oyamada .................... | 257/727 |
| 5,344,334 A | * | 9/1994 | Laub et al. .................. | 439/331 |
| 6,086,387 A | * | 7/2000 | Gallagher et al. ............ | 439/71 |
| 6,752,636 B2 | * | 6/2004 | Ma .............................. | 439/73 |
| 6,758,684 B2 | * | 7/2004 | Oikawa et al. ............... | 439/73 |
| 6,758,691 B1 | * | 7/2004 | McHugh et al. ............ | 439/331 |
| 6,776,625 B2 | * | 8/2004 | Ma .............................. | 439/73 |
| 2004/0115965 A1 | * | 6/2004 | Ma .............................. | 439/73 |
| 2004/0142584 A1 | * | 7/2004 | Ma .............................. | 439/73 |
| 2004/0142585 A1 | * | 7/2004 | Ma et al. ...................... | 439/73 |

* cited by examiner

Primary Examiner—Tho D. Ta
Assistant Examiner—Larisa Tsukerman
(74) Attorney, Agent, or Firm—Wei Te Chung

(57) ABSTRACT

An electrical connector assembly (1) includes a base (10), a frame (13) assembled on the base, and a fixing member (11) engaged with the base. The base defines first and second installation portions (12, 15) having first and second pivot holes (120, 121) therein. An orientation portion (1210) is formed adjacent the second installation portion, thereby defining a fastening slot (1212) therebetween. The fixing member includes an actuator lever (14) and a fastening ring (114) having an opening. The actuator lever includes an actuator (110) and an operation handle (113). When the fixing member and the base are assembled together, the actuator is installed into the base via the pivot holes, the fastening ring clasps the actuator, and the fastening ring is positioned in the fastening slot. Thus, during rotation of the actuator lever, the fastening ring enables reliable positioning of the actuator lever relative to the frame.

8 Claims, 5 Drawing Sheets

ELECTRICAL CONNECTOR ASSEMBLY HAVING RESTRAINING STRUCTURE

BACKGROUND OF THE INVENTION

1. Field of the Invention

The present invention relates to an electrical connector assembly used for electrically connecting a land grid array (LGA) integrated circuit (IC) module to a printed circuit board (PCB).

2. Description of the Prior Art

An electrical connector assembly used for electrically connecting an LGA IC module to a PCB is widely applied in the field of electronics, and a correlative article is found in *Nonlinear Analysis Helps Design LGA Connectors* (Connector Specifier, February 2001). A conventional electrical connector assembly of this kind comprises a base, a frame assembled with the base, and a fixing member. Said fixing member defines an actuator and an operation handle vertically extending from the actuator. The actuator defines two pivot portions and an action portion connecting between the two pivot portions. Two pivot holes are defined in one side of the base, the pivot holes being adapted to cooperate with the two pivot portions of the actuator. Examples of this kind of electrical connector assembly are disclosed in U.S. Pat. Nos. 4,504,105, 4,621,884, 4,692,790 and 5,344,334.

FIGS. 5 and 6 show a conventional electrical connector assembly 6 comprising a base 63, a fixing member 62 assembled with the base 63, and a frame 64 engaged with the base 63. The frame 64 has a groove 644, and is pivotably attached to one side of the base 63. The fixing member 62 is pivotably attached an opposite side of the base 63. The fixing member 62 comprises an actuator 620, and an operation handle 622 perpendicularly extending from the actuator 620. The actuator 620 defines two pivot portions 623, and an action portion 621 positioned therebetween. Two pivot holes 66 are defined in said opposite side of the base 63, the pivot holes 66 being adapted to cooperate with the two pivot portions 623 of the actuator 620. When the electrical connector assembly is used, the frame 64 is actuated to a vertical position, an LGA IC module (not shown) is positioned within the base 63 under the frame 64, and then the frame 64 is actuated to press on the LGA IC module. Driven by the operation handle 622, the action portion 621 moves into the groove 644 of the frame 64 and presses the frame 64 onto the IC module. Thus the frame 64 is firmly fastened on the IC module, and the IC module is fixed on the electrical connector assembly reliably. During the course of rotation of the operation handle 622 about an axis defined by the pivot holes 66, the fixing member 62 may move laterally because of the lack of constraint in the pivot holes 66. Thus can result in mis-alignment between the action portion 621 and the groove 644 of the frame 64. When this happens, the LGA IC module is not properly retained in the electrical connector.

Hence, a new electrical connector assembly having a restraining structure is desired to overcome the above-described disadvantages.

SUMMARY OF THE INVENTION

An object of the present invention is to provide an electrical connector assembly having an effective orientation structure.

Another object of the present invention is to provide an electrical connector assembly with reliable and effective performance.

In order to achieve the aforementioned objects, an electrical connector assembly in accordance with a preferred embodiment of the present invention comprises a base, a frame assembled on the base, and a fixing member engaged with the base. The base defines two installation portions, each installation portion defining a pivot hole. An orientation portion is formed adjacent one of the installation portions, thereby defining a fastening slot therebetween. The fixing member comprises an actuator lever and a fastening ring having an opening. The actuator lever includes an actuator, and an operation handle perpendicularly extending from the actuator. When the fixing member and the base are assembled together, the actuator is installed into the base via the pivot holes defined in the installation portions of the base, the fastening ring clasps the actuator, and the fastening ring is positioned in the fastening slot. Thus, during the course of rotation of the actuator lever, the fastening ring ensures reliable positioning of the actuator lever relative to the frame.

In an alternative embodiment, the first pivot hole of the first installation portion perforates the first installation portion incompletely, and the fastening ring clasping the actuator is positioned between the first installation portion and the second installation portion, close to a side of the second installation portion.

Other objects, advantages and novel features of the present invention will become more apparent from the following detailed description when taken in conjunction with the accompanying drawings.

DESCRIPTION OF THE PREFERRED EMBODIMENTS

Figure 1:
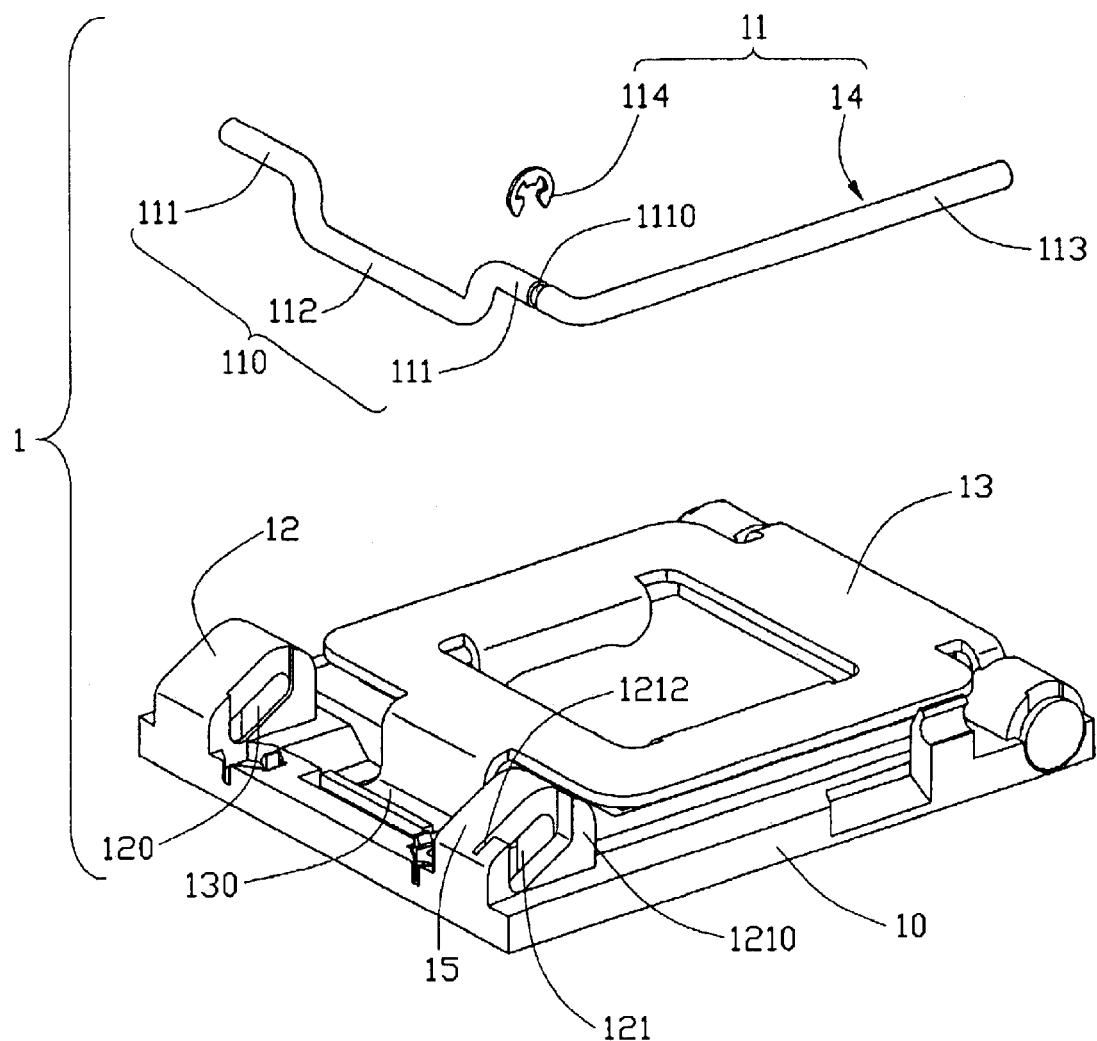
FIG. 1 is an exploded, isometric view of an electrical connector assembly in accordance with the preferred embodiment of the present invention.

Reference will now be made to the drawing figures to describe the present invention in detail.

Referring to FIG. 1, an electrical connector assembly 1 in accordance with a preferred embodiment of the present invention is adapted to electrically connect a land grid array (LGA) integrated circuit (IC) module (not shown) to a printed circuit board (PCB) (not shown). The electrical connector assembly 1 comprises a base 10, a fixing member 11 assembled with the base 10, and a frame 13 having a groove 130. The frame 13 is hinged with the base 10 at a location opposite from the fixing member 11. The fixing member 11 comprises an actuator lever 14, and a fastening ring 114 having an opening. The actuator lever 14 defines an actuator 110, and an operation handle 113 perpendicularly extending from the actuator 110. The actuator 110 comprises two pivot portions 111, and an action portion 112 parallel to and interconnecting the pivot portions 111. The action portion 112 is adapted to cooperate with the groove 130 of the frame 13. The base 10 forms a first installation portion 12 with a first pivot hole 120 therein, and a second installation portion 15 with a second pivot hole 121 therein. The first pivot hole 120 and the second pivot hole 121 are approximately elliptical, and form an oblique angle relative to the base 10. An orientation portion 1210 is formed adjacent the second installation portion 15, with a fastening slot 1212 defined therebetween. The fastening slot 1212 is adapted to receive the fastening ring 114. The pivot portion 111 connecting to the operation handle 113 defines an arc-shaped channel 1110 adapted to clip the fastening ring 114 therein. A diameter of the fastening ring 114 is greater than a length of a short axis of the second pivot hole 121.

Figure 2:
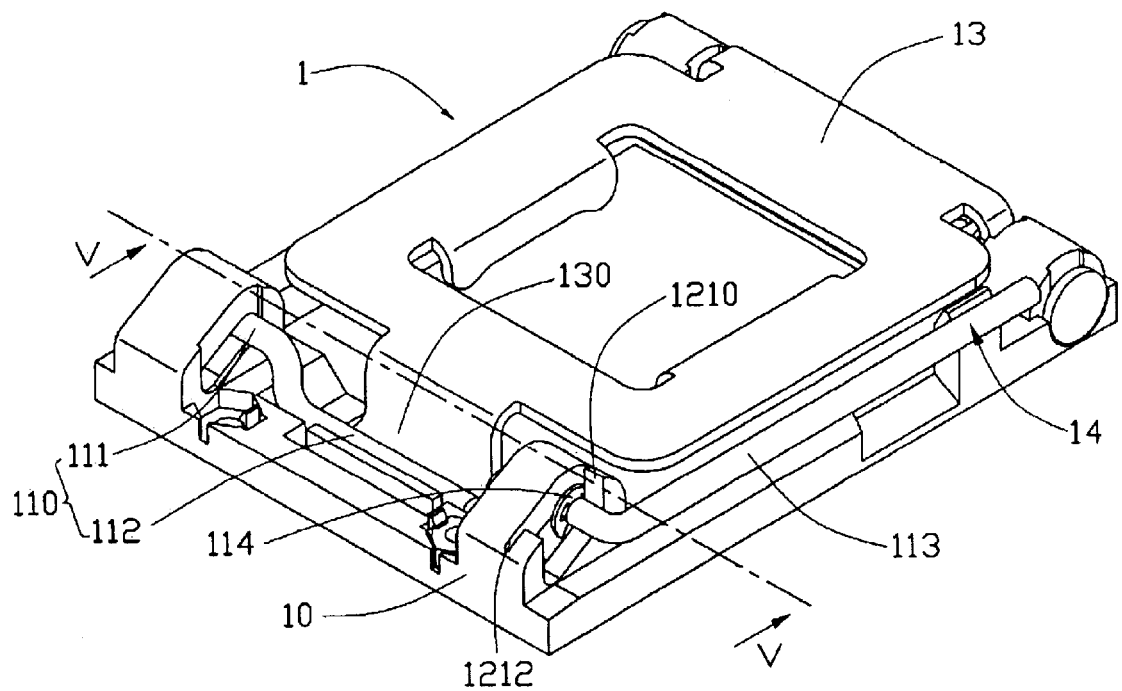
FIG. 2 is an assembled view of FIG. 1.
Figure 3:
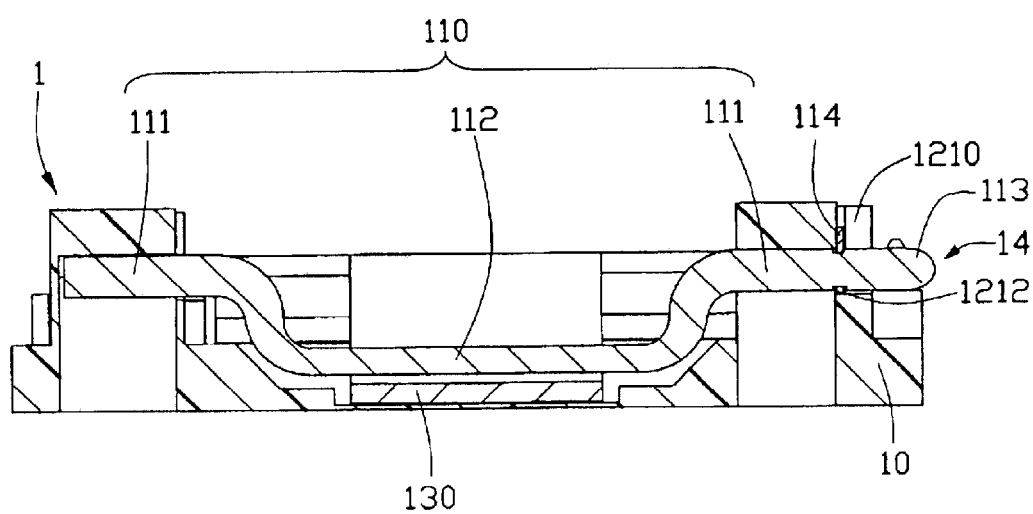
FIG. 3 is a cross-sectional view taken along line III—III of FIG. 2.

Referring to FIGS. 2 and 3, when the fixing member 11 and the base 10 are assembled together, the actuator 110 is assembled with the base 10 via the first installation portion 12 and the second installation portion 15. The two pivot portions 111 are supported in the first pivot hole 120 and the second pivot hole 121 respectively. After that, the fastening ring 114 clasps the actuator 110 by cooperating with the channel 1110, and the fastening ring 114 is positioned in the fastening slot 1212. When the electrical connector assembly 1 is used, the frame 13 is actuated to a vertical position and the LGA IC module (not shown) is positioned on the base 10. The frame 13 is then actuated to press on the LGA IC module. Driven by the operation handle 113, the action portion 112 moves into the groove 130 of the frame 13 and presses the frame 13 toward and onto the LGA IC module. The frame 13 is thus firmly fastened on the LGA IC module, and as a result, the LGA IC module is fixed on the electrical connector assembly 1 reliably.

During operation of the operation handle 113, the fixing member 11 is restricted because of cooperation of the fastening ring 114 and the fastening slot 1212. Therefore, the action portion 112 is limited in position such that the action portion 112 accurately cooperates with the groove 130 of the frame 13 and enables reliable and effective performance.

Figure 4:
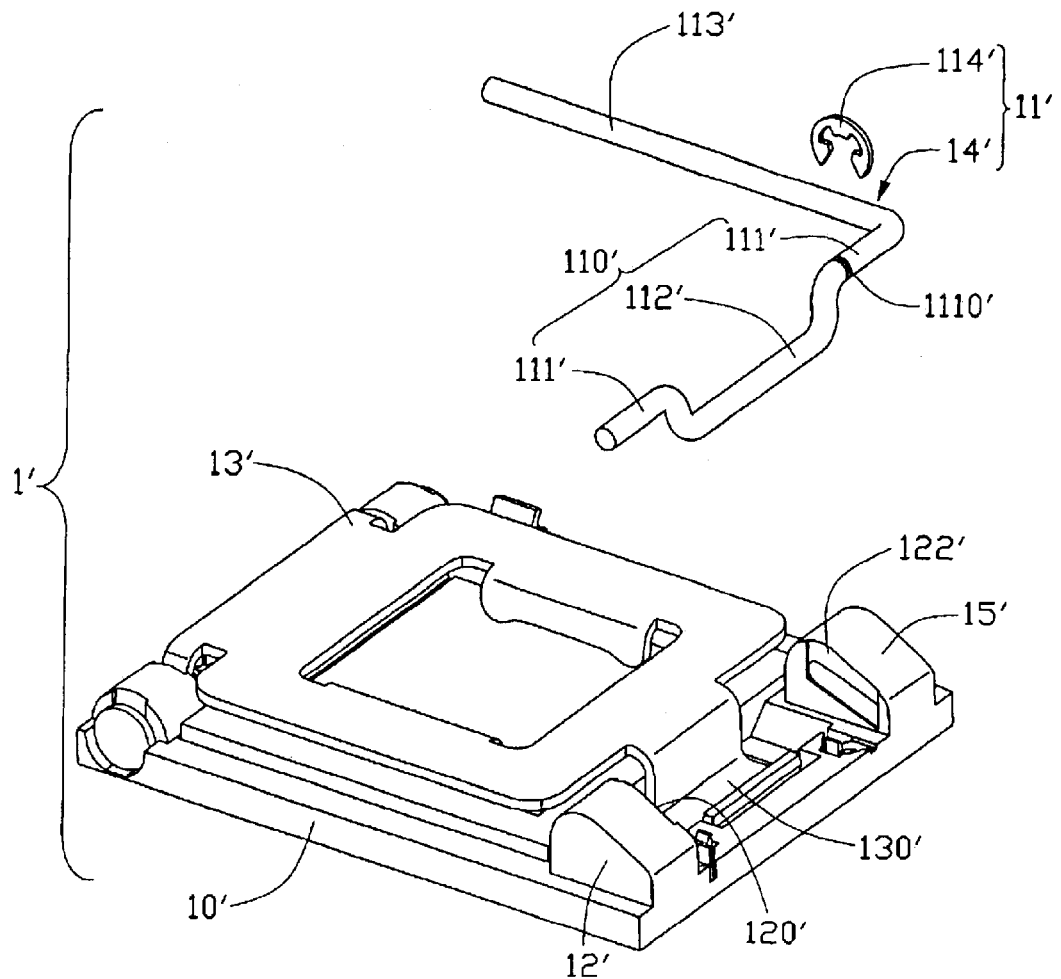
FIG. 4 is an exploded, isometric view of an electrical connector assembly in accordance with an alternative embodiment of the present invention.
Figure 5:
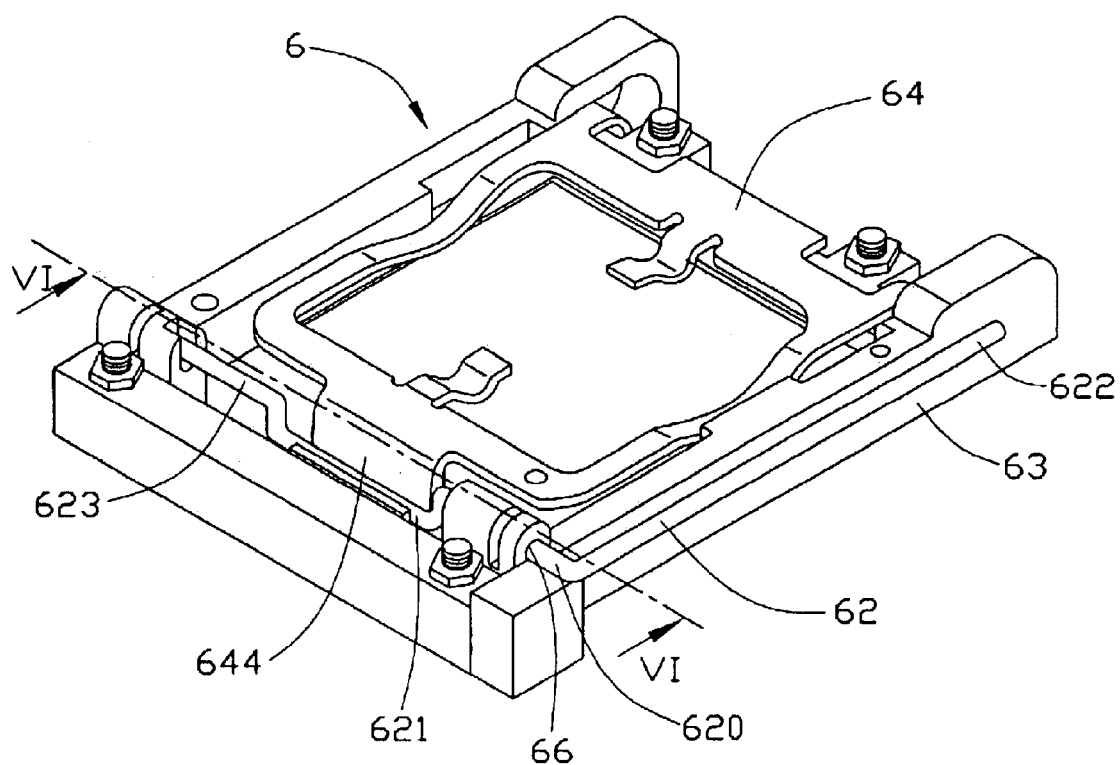
FIG. 5 is an isometric view of a conventional electrical connector assembly.
Figure 6:
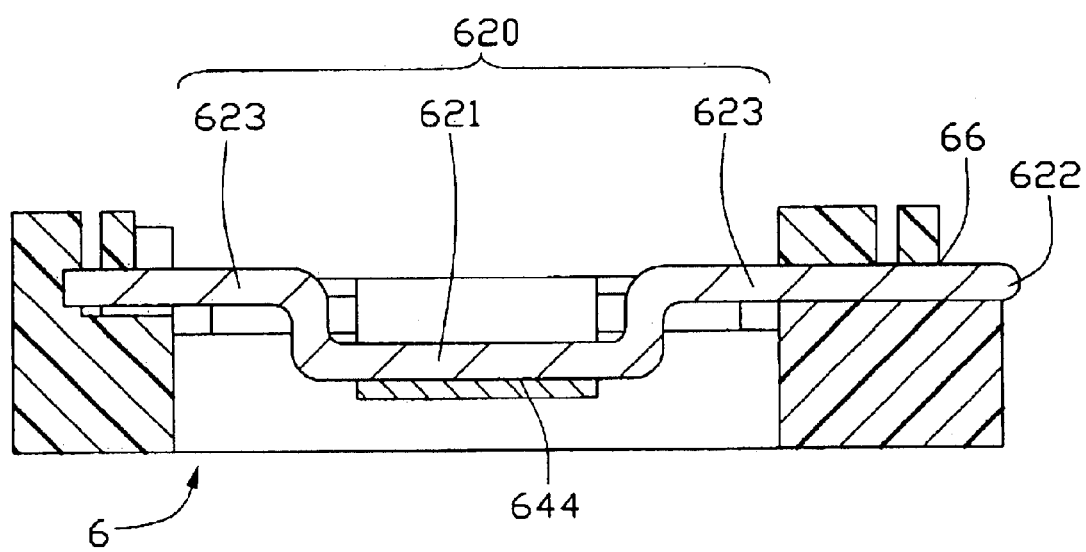
FIG. 6 is a cross-sectional view taken along line VI—VI of FIG. 5.

Referring to FIG. 4, an electrical connector assembly 1' in accordance with an alternative embodiment of the present invention has a structure similar to that of the electrical connector assembly 1 of the preferred embodiment. The electrical connector assembly 1' comprises a base 10', a fixing member 11' assembled with the base 10', and a frame 13' having a groove 130'. The frame 13' is hinged with the base 10' opposite from the fixing member 11'. The base 10' defines a first installation portion 12' defining a first pivot hole 120' therein, and a second installation portion 15' defining a second pivot hole therein. The first pivot hole 120' perforates the first installation portion 12' incompletely. The fixing member 11' comprises an actuator lever 14', and a fastening ring 114' having an opening. The actuator lever 14' defines an actuator 110', and an operation handle 113' perpendicularly extending from the actuator 110'. The actuator 110' comprises two pivot portions 111', and an action portion 112'. An arc-shaped channel 1110' is defined in the pivot portion 111' close to the operation handle 113', the channel 1110' being adapted to clip the fastening ring 114' therein. When the fixing member 11' and the base 10' are assembled together, the fastening ring 114' clasping the actuator 110' is positioned between the first installation portion 12' and the second installation portion 15', close to a side 122' of the second installation portion 15'. The electrical connector assembly 1' can perform substantially the same functions as described above in relation to the electrical connector assembly 1 of the preferred embodiment.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

What is claimed is:

1. An electrical connector assembly used for retaining and electrically connecting an integrated circuit module to a printed circuit board, the electrical connector assembly comprising:
   a base defining at least one installation portion, the at least one installation portion having at least one pivot hole and at least one orientation portion adjacent the at least one installation portion, the at least one orientation portion having a fastening slot;
   a frame assembled to the base opposite from the installation portion;
   a fixing member comprising an actuator lever and a fastening ring, the fastening ring having an opening, the actuator lever comprising an actuator and an operation handle, the actuator being assembled with the base via the pivot hole and being clasped by the fastening ring for preventing lateral movement of the actuator relative to the frame, wherein a diameter of the fastening ring is greater than a length of a short axis of the pivot hole.

2. The electrical connector assembly as described in claim 1, wherein the operation handle of the actuator lever is approximately perpendicular to the actuator.

3. The electrical connector assembly as described in claim 1, wherein the actuator comprises two pivot portions and an intermediary action portion parallel to the pivot portions.

4. The electrical connector assembly as described in claim 1, wherein the frame defines a groove adapted to cooperate with the actuator.

5. An electrical connector assembly comprising:
   a base defining a first installation portion having a first pivot hole therein and a second installation portion having a second pivot hole therein, the first pivot hole perforating the first installation portion incompletely;
   a frame assembled with the base opposite from the installation portions;
   a fixing member comprising an actuator lever and a fastening ring having an opening, the actuator lever comprising an actuator and an operation handle; wherein
   when the fixing member and the base are assembled together, the actuator is assembled with the base via the first pivot hole and the second pivot hole and the fastening ring clasps the actuator in the opening, positioning between the first installation and the second installation portion and close to the side of the second installation portion, and during rotation of the actuator lever, the fastening ring enables reliable positioning of the actuator lever relative to the frame and prevents lateral movement of the actuator relative to the frame, wherein a diameter of the fastening ring is greater than a length of a short axis of the second pivot hole.

6. The electrical connector assembly as described in claim 5, wherein the operation handle of the actuator lever is perpendicular to the actuator.

7. The electrical connector assembly as described in claim 5, wherein the actuator comprises two pivot portions and an intermediary action portion parallel to the pivot portions.

8. The electrical connector assembly as described in claim 5, wherein the frame defines a groove adapted to cooperate with the action portion.

* * * * *